(12) United States Patent
Hirano et al.

(10) Patent No.: US 10,780,506 B2
(45) Date of Patent: Sep. 22, 2020

(54) TOOL AND COATED TOOL

(71) Applicant: TUNGALOY CORPORATION, Fukushima (JP)

(72) Inventors: Yusuke Hirano, Iwaki (JP); Yuichiro Fukushima, Iwaki (JP)

(73) Assignee: TUNGALOY CORPORATION, Iwaki-shi, Fukushima (JP)

( * ) Notice: Subject to any disclaimer, the term of this patent is extended or adjusted under 35 U.S.C. 154(b) by 256 days.

(21) Appl. No.: 15/777,606

(22) PCT Filed: Nov. 25, 2016

(86) PCT No.: PCT/JP2016/085049
§ 371 (c)(1),
(2) Date: May 18, 2018

(87) PCT Pub. No.: WO2017/094628
PCT Pub. Date: Jun. 8, 2017

(65) Prior Publication Data
US 2020/0078868 A1 Mar. 12, 2020

(30) Foreign Application Priority Data
Dec. 4, 2015 (JP) .................... 2015-237489

(51) Int. Cl.
*B23B 27/14* (2006.01)
*B23B 51/00* (2006.01)
(Continued)

(52) U.S. Cl.
CPC .............. *B23B 27/14* (2013.01); *B23B 51/00* (2013.01); *C22C 29/16* (2013.01); *B23B 27/22* (2013.01);
(Continued)

(58) Field of Classification Search
USPC .......... 51/307, 309; 428/336, 469, 472, 698, 428/704
See application file for complete search history.

(56) References Cited

U.S. PATENT DOCUMENTS 5,336,922 A * 8/1994 Sakamoto ......... H01L 27/10808
257/534
2010/0132266 A1* 6/2010 Twersky .............. C22C 26/00
51/309
(Continued)

FOREIGN PATENT DOCUMENTS

JP 2004-026555 A 1/2004
JP 2004-204258 A 7/2004
(Continued)

OTHER PUBLICATIONS

International Search Report issued in PCT/JP2016/085049; dated Feb. 14, 2017.
(Continued)

*Primary Examiner* — Archene A Turner
(74) *Attorney, Agent, or Firm* — Studebaker & Brackett PC

(57) ABSTRACT

A tool having a cutting edge that includes a sintered body containing cubic boron nitride. The sintered body integrally and inseparably includes an inner region and a binder phase enriched layer formed on at least part of a surface of the inner region. The inner region includes: 15-90 volume % of cubic boron nitride; and 10-85 volume % of a mixture of a binder phase and impurities. The binder phase enriched layer includes: 90-100 volume % of the binder phase and impurities mixture; and 0-10 volume % of cubic boron nitride; and the binder phase contains at least one kind selected from the group consisting of: at least one element selected from the group consisting of Ti, Zr, Hf, V, Nb, Ta, Cr, Mo, W, Al,
(Continued)

Co, Ni and Si; and a compound of the element and at least one element selected from the group consisting of C, N, O and B.

20 Claims, 1 Drawing Sheet

(51) Int. Cl.
  *C22C 29/16* (2006.01)
  *B23B 27/22* (2006.01)
  *B23C 5/16* (2006.01)
(52) U.S. Cl.
  CPC ....... *B23B 2222/04* (2013.01); *B23B 2222/64* (2013.01); *B23B 2222/88* (2013.01); *B23B 2226/125* (2013.01); *B23B 2228/105* (2013.01); *B23C 5/16* (2013.01)

(56) References Cited

U.S. PATENT DOCUMENTS

2013/0034712 A1* 2/2013 Kudoh .............. C04B 35/62675
  428/323
2013/0309468 A1* 11/2013 Kudo .................... C04B 35/583
  428/336

FOREIGN PATENT DOCUMENTS

| JP | 2004-223648 A | 8/2004 |
| JP | 2006-281386 A | 10/2006 |

OTHER PUBLICATIONS

International Preliminary Report on Patentability and Written Opinion issued in PCT/JP2016/085049; dated Jun. 5, 2018.

* cited by examiner

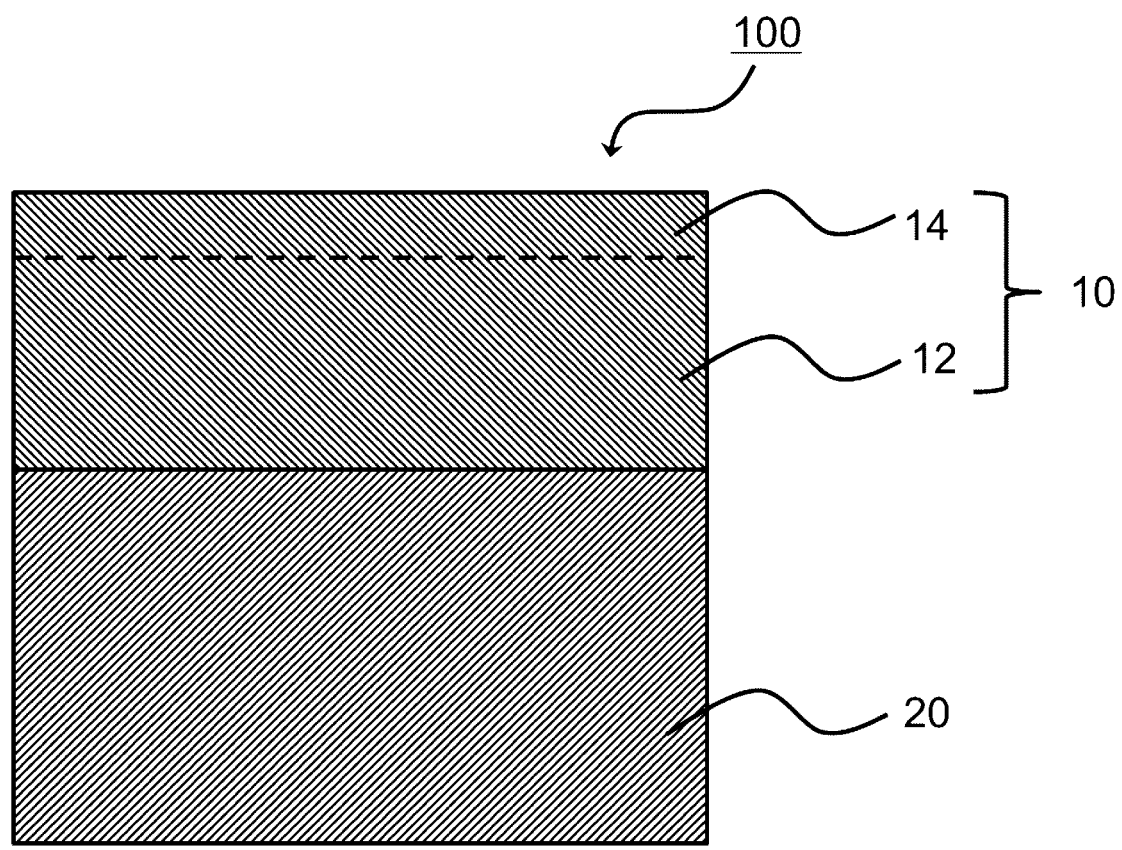

TOOL AND COATED TOOL

TECHNICAL FIELD

The present invention relates to a tool and a coated tool.

BACKGROUND ART

Cubic boron nitride has the second highest hardness after diamond and has excellent thermal conductivity. Cubic boron nitride is also characterized in having a low affinity for iron. A sintered body consisting of cubic boron nitride and a binder phase of a metal or ceramic (hereinafter referred to as a "cubic boron nitride sintered body" in the Background Art section) has been applied to cutting tools, wear resistant tools, etc.

For instance, as to the prior art concerning such cubic boron nitride sintered body, a hard sintered body cutting tool with a chip breaker is known which contains 20 volume % or more of cubic boron nitride, wherein: the hard sintered body cutting tool has a tool rake surface formed, via at least one machining step with a laser, in a projected shape or a combined shape of a recess and a projection; and, in the tool rake surface, a part thereof, in its entirety, which consists of a hard sintered body portion has a polished surface obtained by polishing with free abrasive grains (see Patent Document 1).

Further, in a hard sintered body cutting tool comprised of a cubic boron nitride sintered body, at least the surface of a tool rake surface of a cutting edge is irradiated with an electron beam, whereby, after diamond and/or cubic boron nitride located within 20 μm in depth below the surface of the tool rake surface is transformed into a ceramic structure, the surface of the tool rake surface is polished by a polishing method with free abrasive grains, so that the ceramic structure is reduced or removed and the surface of the tool rake surface is smoothly finished (see Patent Document 2).

CITATION LIST

Patent Documents

Patent Document 1: JP2004-223648 A
Patent document 2: JP2006-281386 A

SUMMARY

Technical Problem

While there has been a trend in which cutting conditions are severe, compared with the prior art, in order to increase machining efficiency, a longer tool life than so far is being demanded. However, in the hard sintered body cutting tool with a chip breaker disclosed in Patent Document 1 above, cracking is generated in the surface of the sintered body due to thermal effects resulting from heating caused by laser machining which locally involves a temperature of from 1,000° C. or higher to 3,000° C. or lower. As a result, the hard sintered body cutting tool disclosed in Patent Document 1 has the problem of reduced strength of an edge thereof. Further, since the surface of the rake surface in the sintered body reaches high temperatures due to laser machining, cubic boron nitride contained in the surface is transformed into hexagonal boron nitride. As a result, the hard sintered body cutting tool disclosed in Patent Document 1 has the problem of reduced crater wear resistance. The progress of crater wear invites a reduced strength of the edge, thereby leading to the occurrence of chipping or fracturing, as a result of which the tool life is shortened.

In the hard sintered body cutting tool of Patent Document 2 above, after cubic boron nitride is transformed into a ceramic structure, the surface of the tool rake surface is polished by the free polishing method, so that cubic boron nitride is exposed. Since cubic boron nitride is prone to involve the progress of reaction wear, the hard sintered body cutting tool of Patent Document 2 does not have sufficient crater wear resistance.

The present invention has been made in order to solve the above problems, and an object of the present invention is to provide a tool in which at least part of a cutting edge thereof is comprised of a sintered body containing cubic boron nitride, and to provide a coated tool comprising, on a surface of the tool, a coating layer, the tool and the coated tool, each involving an improvement of crater wear resistance and in turn involving improvements of chipping resistance and fracture resistance, thereby leading to a longer tool life.

Solution to Problem

The present inventors have conducted studies regarding a tool having a sintered body portion containing cubic boron nitride and have accordingly found that an improvement in the oxidation resistance of the sintered body portion is effective in order to suppress crater wear of the sintered body portion. The present inventors have completed the present invention based on such findings.

The gist of the present invention is as set forth below.

(1) A tool in which at least part of a cutting edge thereof comprises a sintered body containing cubic boron nitride, wherein:

the sintered body integrally and inseparably comprises an inner region and a binder phase enriched layer formed on at least part of a surface of the inner region;

the inner region comprises: 15 volume % or more to 90 volume % or less of cubic boron nitride; and 10 volume % or more to 85 volume % or less of a mixture of a binder phase and inevitable impurities;

the binder phase enriched layer comprises: 90 volume % or more to 100 volume % or less of the mixture of the binder phase and the inevitable impurities; and 0 volume % or more to 10 volume % or less of cubic boron nitride; and the binder phase comprises at least one kind selected from the group consisting of: an element of at least one kind selected from the group consisting of Ti, Zr, Hf, V, Nb, Ta, Cr, Mo, W, Al, Co, Ni and Si; and a compound of the element and an element of at least one kind selected from the group consisting of C, N, O and B.

(2) The tool according to (1), wherein, in a surface of the sintered body, the binder phase enriched layer constitutes from 30 area % or more to 100 area % or less of the surface of the sintered body in its entirety, and the inner region constitutes from 0 area % or more to 70 area % or less of the surface of the sintered body in its entirety.

(3) The tool according to (1) or (2), wherein an average thickness of the binder phase enriched layer is from 0.1 μm or more to 8.0 μm or less.

(4) The tool according to any of (1) to (3), wherein the binder phase comprises compositions of at least two kinds selected from the group consisting of Ti, Co, Cr, Ni, Al, AlN, $Al_2O_3$, $AlB_2$, TiN, TiC, Ti(C,N), $TiB_2$, $Cr_2N$, WC, $ZrO_2$, ZrO, ZrN, $ZrB_2$ and $Si_3N_4$.

(5) A coated tool comprising: the tool according to any of (1) to (4); and a coating layer formed on a surface of the tool.

(6) The coated tool according to (5), wherein the coating layer comprises a compound of: an element of at least one kind selected from the group consisting of Ti, Zr, Hf, V, Nb, Ta, Cr, Mo, W, Al and Si; and an element of at least one kind selected from the group consisting of C, N, O and B.

(7) The coated tool according to (5) or (6), wherein the coating layer is comprised of a single layer or multiple layers of two or more layers.

(8) The coated tool according to any of (5) to (7), wherein an average thickness of the coating layer in its entirety is from 0.5 μm or more to 20 μm or less.

Advantageous Effects of Invention

The present invention can provide a tool in which at least part of a cutting edge thereof is comprised of a sintered body containing cubic boron nitride, and can provide a coated tool comprising, on a surface of the tool, a coating layer, the tool and the coated tool, each involving an improvement of crater wear resistance and in turn involving improvements of chipping resistance and fracture resistance, thereby leading to a longer tool life.

BRIEF DESCRIPTION OF DRAWINGS

FIG. 1 is a schematic cross-sectional view showing an embodiment of a tool according to the present invention.

DESCRIPTION OF EMBODIMENTS

An embodiment for carrying out the present invention (hereinafter simply referred to as the "present embodiment") will hereinafter be described in detail, with reference to the attached drawings as appropriate. However, the present invention is not limited to the present embodiment below. Various modifications may be made to the present invention without departing from the gist of the invention. It should be noted that, in the drawings, the same elements are denoted by the same symbols and will not be further explained. Unless otherwise specified, positional relationships, such as vertical and horizontal relationships, are based on the positional relationships shown in the drawings. Further, the dimensional ratios of the drawings are not limited to those shown therein.

A tool according to the present embodiment is comprised of a sintered body in which at least part of a cutting edge thereof contains cubic boron nitride (hereinafter referred to as a "cubit boron nitride sintered body"). More specifically, the tool of the present embodiment preferably has a configuration in which a cubic boron nitride sintered body and a base metal (substrate) are formed in an integrated manner. The base metal is not particularly limited, as long as it may be used as a base metal for the tool. Examples of the base metal include a cemented carbide, cermet and ceramic, and it is preferable to employ the cemented carbide. However, the tool of the present embodiment does not have to include the base metal, as a matter of course. The tool of the present embodiment with the above configuration can be effectively used particularly in the machining of iron-based sintered alloys or difficult-to-machine cast iron. Such tool of the present embodiment can also be used effectively in various types of machining of general metals. Herein, the term "at least part of a cutting edge" refers to, in a cutting edge of a tool, a portion thereof which comes into contact with a workpiece.

The tool of the present embodiment can be applied usefully to, for example, a drill, an end mill, an indexable cutting chip for milling or turning, a gear cutting tool, a reamer and a tap.

The cubic boron nitride sintered body in the tool of the present embodiment comprises cubic boron nitride, a binder phase and inevitable impurities.

The cubic boron nitride sintered body of the present embodiment integrally and inseparably comprises an inner region and a binder phase enriched layer formed on at least part of a surface of the inner region. FIG. 1 is a schematic cross-sectional view showing an embodiment of a tool according to the present embodiment. A tool 100 comprises a cubic boron nitride sintered body 10 and a base metal 20, and the cubic boron nitride sintered body 10 integrally and inseparably comprises an inner region 12 and a binder phase enriched layer 14 formed on a surface of the inner region 12. Herein, the term "integrally and inseparably" indicates that, in the cubic boron nitride sintered body, no cleavage exists between the inner region and the binder phase enriched layer. The inner region comprises: 15 volume % or more to 90 volume % or less of cubic boron nitride; and 10 volume % or more to 85 volume % or less of a mixture of a binder phase and inevitable impurities. Further, the binder phase enriched layer comprises: 90 volume % or more to 100 volume % or less of a mixture of a binder phase and inevitable impurities; and 0 volume % or more to 10 volume % or less of cubic boron nitride. That is, the binder phase enriched layer arbitrarily contains cubic boron nitride.

In the inner region of the cubic boron nitride sintered body, if, based on the total content (100 volume %) of the inner region, the content of cubic boron nitride is 15 volume % or more and the content of the mixture of the binder phase and the inevitable impurities is 85 volume % or less, this leads to an improvement of fracture resistance as the strength of the cubic boron nitride sintered body is kept high. Meanwhile, in the inner region of the cubic boron nitride sintered body, if, based on the total content (100 volume %) of the inner region, the content of cubic boron nitride is 90 volume % or less and the content of the mixture of the binder phase and the inevitable impurities is 10 volume % or more, this can suppress an increase in the number of pores as the content of the binder phase necessary for binding between cubic boron nitride particles can be ensured, thereby leading to an improvement of fracture resistance because the occurrence of fracturing which starts from pores can be prevented. From the same perspective, the inner region preferably comprises: 20 volume % or more to 90 volume % or less of cubic boron nitride; and 10 volume % or more to 80 volume % or less of the mixture of the binder phase and the inevitable impurities.

In the binder phase enriched layer of the cubic boron nitride sintered body, if, based on the total content (100 volume %) of the binder phase enriched layer, the content of cubic boron nitride is 10 volume % or less and the content of the mixture of the binder phase and the inevitable impurities is 90 volume % or more, this allows the effect of suppressing reaction wear to be further enhanced. This leads to improvements of chipping resistance and fracture resistance as the progress of crater wear is suppressed.

The binder phase in the cubic boron nitride sintered body of the present embodiment comprises at least one kind selected from the group consisting of: an element of at least one kind selected from the group consisting of Ti, Zr, Hf, V, Nb, Ta, Cr, Mo, W, Al, Co, Ni and Si; and a compound of the element and an element of at least one kind selected from the group consisting of C, N, O and B. In particular, the binder phase preferably comprises at least one kind selected from the group consisting of: an element of at least one kind selected from the group consisting of Ti, Zr, Cr, W, Al, Co, Ni and Si; and a compound of the element and an element of at least one kind selected from the group consisting of C, N, O and B. The binder phase more preferably comprises compositions of at least two kinds selected from the group consisting of Ti, Co, Cr, Ni, Al, AlN, $Al_2O_3$, $AlB_2$, TiN, TiC, Ti(C,N), $TiB_2$, $Cr_2N$, WC, $ZrO_2$, ZrO, ZrN, $ZrB_2$ and $Si_3N_4$, and further preferably comprises compositions of at least two kinds selected from the group consisting of Co, Cr, Ni, $Al_2O_3$, TiN, TiC, Ti(C,N), $TiB_2$, WC, $ZrO_2$, ZrO, ZrN, $ZrB_2$ and $Si_3N_4$. This improves the strength of the cubic boron nitride sintered body.

In the tool of the present embodiment, reaction wear can be suppressed by providing the binder phase enriched layer on the surface of the cubic boron nitride sintered body. This leads to an improvement of crater wear resistance in at least part of the cutting edge of the tool, thereby resulting in improvements of chipping resistance and fracture resistance. Further, the binder phase enriched layer has more excellent adhesion than that of a conventional coating layer formed by CVD, PDV or the like, and thus, this allows for an improvement of wear resistance without a reduction in the chipping resistance and fracture resistance of the tool.

In the cubic boron nitride sintered body, it is particularly preferable for the entire surface thereof to be served by the binder phase enriched layer; however, the entire surface does not necessarily have to be served by the binder phase enriched layer, and part of the inner region may be exposed. More specifically, in the surface of the cubic boron nitride sintered body, it is preferable that: the binder phase enriched layer constitutes from 30 area % or more to 100 area % or less of the entire surface (100 area %) of the cubic boron nitride sintered body; and the inner region constitutes from 0 area % or more to 70 area % or less of the entire surface of the cubic boron nitride sintered body. In the surface of the cubic boron nitride sintered body, if the binder phase enriched layer constitutes 30 area % or more and the inner region constitutes 70 area % or less (or the inner region does not exist) of the entire surface, this indicates the tendency of the effect of suppressing reaction wear to be enhanced, thereby allowing a reduction in fracture resistance to be further suppressed.

If the average thickness of the binder phase enriched layer is 0.1 μm or more, this provides the effect of further suppressing reaction wear, thereby leading to the tendency of the fracture resistance to be further improved. Meanwhile, if the average thickness of the binder phase enriched layer is 8.0 μm or less, this indicates the tendency of the toughness of the surface of the cubic boron nitride sintered body to be further enhanced, thereby leading to the tendency of the fracture resistance to be improved. Therefore, the average thickness of the binder phase enriched layer is preferably from 0.1 μm or more to 8.0 μm or less.

Examples of the inevitable impurities, being impurities which are inevitably contained in the cubic boron nitride sintered body of the present embodiment, include lithium contained in a raw material powder, etc. The total content of the inevitable impurities can generally be limited to 1 mass % or less based on the total content of the cubic boron nitride sintered body, and thus, such total content of the inevitable impurities scarcely affects the characteristic values of the present embodiment. It should be noted that a lower total content of the inevitable impurities is preferred, and the lower limit thereof is not particularly limited.

In the cubic boron nitride sintered body of the present embodiment, the respective contents (volume %) of the cubic boron nitride and the binder phase in each of the binder phase enriched layer and the inner region can be obtained by analyzing a structural photograph of the cubic boron nitride sintered body which has been taken by a scanning electron microscope (SEM), using commercially available image analysis software. More specifically, the cubic boron nitride sintered body is mirror-polished in a direction orthogonal to a surface thereof. Next, using the SEM, an observation is conducted on a backscattered electron image of the mirror-polished surface of the cubic boron nitride sintered body which has appeared via the mirror polishing. At this time, the mirror-polished surface of the cubic boron nitride sintered body, which has been magnified from 5,000 times or more to 20,000 times or less using the SEM, is observed via a backscattered electron image. Using an energy-dispersive X-ray spectroscope (EDS) included with the SEM, it can be determined that: a black region refers to cubic boron nitride; and a gray region and a white region each refer to a binder phase. Thereafter, a structural photograph is taken of the above cross-sectional surface of the cubic boron nitride sintered body, using the SEM. With commercially available image analysis software, the respective occupied areas of the cubic boron nitride and the binder phase are obtained from the obtained structural photograph, and the contents (volume %) are obtained from the occupied areas. At this time, a region which ranges from the surface of the cubic boron nitride sintered body, in the depth direction below such surface, and in which the total content of the binder phase and the inevitable impurities constitutes from 90 volume % or more to 100 volume % or less is defined as a binder phase enriched layer, and a region located more inward in terms of depth than the binder phase enriched layer is defined as an inner region. Further, the thicknesses of the binder phase enriched layer are measured from the structural photographs taken, with the above-described method, at any three or more locations, and the average value of the resulting measurements can be defined as an average thickness of the binder phase enriched layer.

Herein, the mirror-polished surface of the cubic boron nitride sintered body is a cross-sectional surface of the cubic boron nitride sintered body which is obtained by mirror-polishing the surface of the cubic boron nitride sintered body or any cross-sectional surface thereof. Examples of a method of obtaining a mirror-polished surface of a cubic boron nitride sintered body include a polishing method with the use of diamond paste.

The composition of a binder phase can be identified using a commercially available X-ray diffractometer. For instance, when performing an X-ray diffraction measurement, with an X-ray diffractometer (product name "RINT TTR III") manufactured by Rigaku Corporation, by means of a 2θ/θ focusing optical system with Cu-Kα radiation under the following conditions, the composition of the binder phase can be identified. Herein, the measurement conditions may be as set forth below: an output: 50 kV, 250 mA; an incident-side solar slit: 5°; a divergence longitudinal slit: ½°; a divergence longitudinal limit slit: 10 mm; a scattering slit: ⅔°; a light-receiving side solar slit: 5°; a light-receiving slit: 0.15 mm; a BENT monochromater; a light-receiving monochrome slit: 0.8 mm; a sampling width: 0.02°; a scan speed: 1°/min; and a 2θ measurement range: 20-50°.

The ratio of area (hereinafter also referred to as the "area ratio") of the binder phase enriched layer and the area ratio of the inner region based on the entire surface of the cubic boron nitride sintered body can be obtained by analyzing a structural photograph of the cubic boron nitride sintered body which has been taken by the SEM, using commercially available image analysis software. More specifically, the surface of the cubic boron nitride sintered body, which has been magnified from 1,000 times or more to 5,000 times or less using the SEM, is observed via a backscattered electron image. At this time, a structural photograph of the surface of the cubic boron nitride sintered body is taken using the SEM. With commercially available image analysis software, the area ratio of the binder phase enriched layer and the area ratio of the inner region can be obtained from the taken structural photograph. The area ratio of the binder phase enriched layer and the area ratio of the inner region may be obtained by filling the inner region with black in the structural photograph and then subjecting the resultant structural photograph to a binarization process by the image analysis software. The area ratios are preferably measured at an arbitrary location of the rake surface or the flank which affects cutting.

A coated tool according to the present embodiment comprises the above-described tool comprised of a cubic boron nitride sintered body and a coating layer formed on a surface of the tool. Such coated tool is preferred because it involves a further improvement of wear resistance. The coated tool of the present embodiment further comprises a binder phase enriched layer on a surface of the cubic boron nitride sintered body. If the coating layer is formed on the surface of the binder phase enriched layer by a CVD or PVD method, this leads to a further improvement in the adhesion of the coating layer. This results in further improvements in the chipping resistance and fracture resistance of the coated tool.

The coating layer according to the present embodiment is not particularly limited, as long as it can be used as a coating layer for the coated tool. The coating layer according to the present embodiment is preferably a layer of a compound containing a first element and a second element. Further, the coating layer according to the present embodiment is preferably comprised of a single layer or multiple layers of two or more layers. The first element is preferably an element of at least one kind selected from the group consisting of Ti, Zr, Hf, V, Nb, Ta, Cr, Mo, W, Al and Si. The second element is preferably an element of at least one kind selected from the group consisting of C, N, O and B. When the coating layer has the above-described configuration, this leads to a further improvement in the wear resistance of the coated tool.

Examples of the coating layer include TiN, TiC, Ti(C,N), TiAlN, TiSiN, TiAlCrSiN and AlCrN. The coating layer may be comprised of either a single layer or multiple layers of two or more layers. From the perspective of further improving wear resistance, the coating layer preferably has a structure in which multiple layers, each having a different composition, are laminated in an alternating manner. When the coating layer is comprised of multiple layers of two or more layers, the average thickness of each layer is preferably from 5 nm or more to 500 nm or less.

The average thickness of the entire coating layer is preferably from 0.5 μm or more to 20 μm or less. If the average thickness of the entire coating layer is 0.5 μm or more, this indicates the tendency of the wear resistance to be further enhanced. If the average thickness of the entire coating layer is 20 μm or less, this indicates the tendency of the fracture resistance to be further enhanced.

The thickness of each layer which constitutes the coating layer and the thickness of the entire coating layer in the coated tool of the present embodiment can be measured from a cross-sectional structure of the coated tool, using an optical microscope, a SEM, a transmission electron microscope (TEM), or the like. It should be noted that, as to the average thickness of each layer and the average thickness of the entire coating layer in the coated tool of the present embodiment, such average thicknesses can be obtained by: measuring, near the position 50 μm from the edge of a surface facing the metal evaporation source, toward the center of such surface, the thickness of each layer and the thickness of the entire coating layer, from each of the cross-sectional surfaces at three or more locations; and calculating the average value of the resulting measurements.

The composition of each layer which constitutes the coating layer in the coated tool of the present embodiment can be measured, from a cross-sectional structure of the coated tool of the present embodiment, using an EDS, a wavelength-dispersive X-ray spectroscope (WDS), or the like.

A method of manufacturing a coating layer in a coated tool according to the present embodiment is not particularly limited. However, examples of such method include physical vapor deposition methods, such as an ion plating method, an arc ion plating method, a sputtering method and an ion mixing method. In particular, the arc ion plating method is further preferable because more excellent adhesion is achieved between the coating layer and the cubic boron nitride sintered body.

For instance, a method of manufacturing a tool according to the present embodiment includes steps (A) to (H) set forth below:

step (A): a step of formulating: 15 volume % or more to 90 volume % or less of cubic boron nitride with an average particle size of from 0.2 μm or more to 5.0 μm or less; and 10 volume % or more to 85 volume % or less of a powder of an element of at least one kind selected from the group consisting of Ti, Zr, Hf, V, Nb, Ta, Cr, Mo, W, Al, Co, Ni and Si, or a powder of a compound of the above element and an element of at least one kind selected from the group consisting of C, N, O and B, with an average particle size of from 0.05 μm or more to 8.0 μm or less (the total should be 100 volume %), and thereby obtaining raw material powders;

step (B): a mixing step of mixing the raw material powders formulated in step (A) with cemented carbide balls by means of a wet ball mill for 5 hours to 24 hours, and thereby preparing a mixture;

step (C): a molding step of molding the mixture obtained in step (B) into a predetermined shape and thereby obtaining a molded body;

step (D): a sintering step of receiving the molded body obtained in step (C) in an ultrahigh-pressure generator, keeping and sintering such molded body at a pressure of from 4.0 GPa or higher to 7.0 GPa or lower and a sintering temperature of from 1,300° C. or higher to 1,500° C. or lower for a predetermined period, and thereby obtaining a sintered body;

step (E): a step of cutting out the sintered body obtained in step (D) so as to match a tool shape by means of an electric discharge machine;

step (F): a step of joining the sintered body cut out in step (E) to a base metal via brazing, and thereby obtaining a pre-honing tool;

step (G): a step of performing honing on a pre-honing tool obtained through step (F), and thereby obtaining a pre-binder-phase-enriched-layer-formation tool; and step (H): a step of performing a picosecond laser process on the pre-binder-phase-enriched-layer-formation tool obtained through step (G) under conditions where the picosecond laser has: an output of from 4 W or higher to 12 W or lower; a pulse width of from 8 ps or more to 27 ps or less; a frequency of from 800 kHz or higher to 1,500 kHz or lower; and a travel speed of from 800 mm/s or higher to 1,500 mm/s or lower, and thereby forming a binder phase enriched layer.

A coated tool according to the present embodiment may be obtained by forming a coating layer on the tool obtained through steps (A) to (H), using chemical or physical vapor deposition.

In step (A), the composition of an inner region of a cubic boron nitride sintered body can be adjusted. Examples of the compositions to be formulated for the binder phase include Ti, Co, Cr, Al, AlN, $Al_2O_3$, TiN, TiC, Ti(C,N), $TiB_2$, WC, $ZrO_2$, ZrN, $ZrB_2$ and $Si_3N_4$.

In step (B), raw material powders for a predetermined formulation composition can be mixed uniformly.

In step (C), the mixture obtained in step (B) is molded into a predetermined shape. The obtained molded body is sintered in step (D) (sintering step) below.

In step (D), the molded body is sintered at a pressure of from 4.0 GPa or higher to 7.0 GPa or lower and a temperature of from 1,300° C. or higher to 1,500° C. or lower, thereby making it possible to manufacture the cubic boron nitride sintered body.

In step (E), using an electric discharge machine, the cubic boron nitride sintered body can be cut out into an arbitrary tool shape.

In step (F), the cut-out cubic boron nitride sintered body and a base metal can be joined to each other via brazing.

In step (G), honing is performed on a pre-honing tool, thereby allowing the strength of the cutting edge to be improved.

In step (H), a binder phase enriched layer can be formed using a picosecond laser. Under conditions where the picosecond laser has: an output of from 4 W or higher to 12 W or lower; a pulse width of from 8 ps or more to 27 ps or less; a frequency of from 800 kHz or higher to 1,500 kHz or lower; and a travel speed of from 800 mm/s or higher to 1,500 mm/s or lower, the content of cubic boron nitride in the binder phase enriched layer can be set to be 10 volume % or less, and, at the same time, the thickness of the binder phase enriched layer can be controlled. The thickness of the binder phase enriched layer is increased as the output of the picosecond laser or the frequency thereof becomes higher. Further, the thickness of the binder phase enriched layer is increased as the period for irradiation with the picosecond laser per unit area of the cubic boron nitride sintered body becomes longer. Therefore, when reducing the travel speed of the picosecond laser or when repeatedly irradiating one location of the cubic boron nitride sintered body with the picosecond laser, the thickness of the binder phase enriched layer is increased.

The area ratio of the binder phase enriched layer and the area ratio of the inner region in the surface of the cubic boron nitride sintered body can be controlled by adjusting the area for irradiation with the picosecond laser. Further, the area ratio of the binder phase enriched layer and the area ratio of the inner region may be controlled by removing the binder phase enriched layer through polishing or grinding.

EXAMPLES

Although the present invention will be described in further detail below, with examples, the present invention is not limited to such examples.

Example 1

Formulation was performed with regard to the formulation compositions shown in Table 1, using a powder of cubic boron nitride (hereinafter referred to as "cBN") with an average particle size of 3.0 μm, a TiN powder with an average particle size of 1.0 μm, a Ti(C,N) powder with an average particle size of 1.0 μm, a TiC powder with an average particle size of 1.0 μm, a $TiB_2$ powder with an average particle size of 0.5 μm, a $ZrO_2$ powder with an average particle size of 0.6 μm, an $Al_2O_3$ powder with an average particle size of 1.0 μm, a WC powder with an average particle size of 2.0 μm, an $Si_3N_4$ powder with an average particle size of 0.4 μm, a Co powder with an average particle size of 1.5 μm, a Cr powder with an average particle size of 8.0 μm, an Ni powder with an average particle size of 1.5 μm and an Al powder with an average particle size of 1.5 μm.

As to comparative samples 4 and 5, formulation was performed with the formulation compositions shown in Table 1 so as to obtain a layer in which the compositions differ from each other between the inner side and the surface side.

TABLE 1

| Sample No. | Formulation composition (volume %) |
|---|---|
| Invention sample 1 | 20% cBN, 20% TiN, 20% Ti(C, N), 35% $Al_2O_3$, 5% Al |
| Invention sample 2 | 45% cBN, 10% TiN, 10% Ti(C, N), 3% $TiB_2$, 25% $Al_2O_3$, 2% WC, 5% Al |
| Invention sample 3 | 60% cBN, 10% TiN, 5% TiC, 5% Ti(C, N), 3% $TiB_2$, 10% $Al_2O_3$, 2% WC, 5% Al |
| Invention sample 4 | 75% cBN, 5% $ZrO_2$, 15% $Al_2O_3$, 5% Al |
| Invention sample 5 | 85% cBN, 1% Co, 1% Cr, 4% Ni, 4% $Al_2O_3$, 5% Al |
| Invention sample 6 | 55% cBN, 15% TiN, 15% Ti(C, N), 5% $TiB_2$, 5% WC, 5% Al |
| Invention sample 7 | 60% cBN, 25% $Al_2O_3$, 10% $Si_3N_4$, 5% Al |
| Invention sample 8 | 55% cBN, 10% TiN, 20% Ti(C, N), 5% $TiB_2$, 5% WC, 5% Al |
| Invention sample 9 | 55% cBN, 10% TiN, 20% Ti(C, N), 5% $TiB_2$, 5% WC, 5% Al |
| Invention sample 10 | 60% cBN, 5% TiN, 10% Ti(C, N), 3% $TiB_2$, 15% $Al_2O_3$, 2% WC, 5% Al |
| Invention sample 11 | 60% cBN, 5% TiN, 10% Ti(C, N), 3% $TiB_2$, 15% $Al_2O_3$, 2% WC, 5% Al |
| Invention sample 12 | 40% cBN, 5% TiN, 20% Ti(C, N), 3% $TiB_2$, 25% $Al_2O_3$, 2% WC, 5% Al |
| Invention sample 13 | 40% cBN, 5% TiN, 20% Ti(C, N), 3% $TiB_2$, 25% $Al_2O_3$, 2% WC, 5% Al |
| Invention sample 14 | 75% cBN, 5% TiN, 5% Ti(C, N), 2% $TiB_2$, 7% $Al_2O_3$, 1% WC, 5% Al |
| Invention sample 15 | 75% cBN, 5% TiN, 5% Ti(C, N), 2% $TiB_2$, 7% $Al_2O_3$, 1% WC, 5% Al |
| Invention sample 16 | 60% cBN, 10% Ti(C, N), 3% $TiB_2$, 20% $Al_2O_3$, 2% WC, 5% Al |
| Comparative sample 1 | 15% cBN, 10% Ti(C, N), 3% $TiB_2$, 65% $Al_2O_3$, 2% WC, 5% Al |
| Comparative sample 2 | 90% cBN, 4% $Al_2O_3$, 1% $Si_3N_4$, 5% Al |
| Comparative sample 3 | 75% cBN, 3% TiN, 5% Ti(C, N), 2% $TiB_2$, 8% $Al_2O_3$, 2% WC, 5% Al |
| Comparative sample 4 | Inner side: 60% cBN, 25% $Al_2O_3$, 10% $Si_3N_4$, 5% Al<br>Surface side: 15% cBN, 55% $Al_2O_3$, 20% $Si_3N_4$, 10% Al |
| Comparative sample 5 | Inner side: 55% cBN, 10% TiN, 20% Ti(C, N), 5% $TiB_2$, 5% WC, 5% Al<br>Surface side: 5% cBN, 30% TiN, 35% Ti(C, N), 10% $TiB_2$, 10% WC, 10% Al |
| Comparative sample 6 | 40% cBN, 5% TiN, 20% Ti(C, N), 3% $TiB_2$, 25% $Al_2O_3$, 2% WC, 5% Al |
| Comparative sample 7 | 60% cBN, 5% TiN, 10% Ti(C, N), 3% $TiB_2$, 15% $Al_2O_3$, 2% WC, 5% Al |

TABLE 1-continued

| Sample No. | Formulation composition (volume %) |
|---|---|
| Comparative sample 8 | 75% cBN, 5% TiN, 5% Ti(C, N), 2% TiB$_2$, 7% Al$_2$O$_3$, 1% WC, 5% Al |

The formulated raw material powders were received, in a ball mill cylinder, together with cemented carbide balls and a hexane solvent and were mixed by means of a wet ball mill. The mixture obtained by such mixing with the ball mill was molded via powder compression so as to obtain a molded body, and then, the molded body was subjected to temporary sintering under the conditions of $1.33 \times 10^{-3}$ Pa and 750° C. so as to obtain a temporarily sintered body. The temporarily sintered body so obtained was received in an ultrahigh-pressure generator and was then sintered under the conditions shown in Table 2. As a result, the cubic boron nitride sintered bodies of invention samples and comparative samples were obtained.

TABLE 2

| Sample No. | Sintering temperature (° C.) | Sintering pressure (GPa) |
|---|---|---|
| Invention sample 1 | 1,300 | 5.5 |
| Invention sample 2 | 1,350 | 4.5 |
| Invention sample 3 | 1,400 | 5.0 |
| Invention sample 4 | 1,450 | 6.0 |
| Invention sample 5 | 1,500 | 7.0 |
| Invention sample 6 | 1,500 | 6.0 |
| Invention sample 7 | 1,500 | 6.0 |
| Invention sample 8 | 1,400 | 5.5 |
| Invention sample 9 | 1,400 | 5.5 |
| Invention sample 10 | 1,450 | 6.0 |
| Invention sample 11 | 1,500 | 5.0 |
| Invention sample 12 | 1,500 | 4.5 |
| Invention sample 13 | 1,500 | 4.5 |
| Invention sample 14 | 1,500 | 6.0 |
| Invention sample 15 | 1,500 | 6.0 |
| Invention sample 16 | 1,500 | 5.0 |
| Comparative sample 1 | 1,300 | 5.5 |
| Comparative sample 2 | 1,500 | 7.0 |
| Comparative sample 3 | 1,400 | 6.0 |
| Comparative sample 4 | 1,500 | 5.0 |
| Comparative sample 5 | 1,500 | 5.0 |
| Comparative sample 6 | 1,500 | 5.5 |
| Comparative sample 7 | 1,500 | 5.5 |
| Comparative sample 8 | 1,500 | 6.0 |

The cubic boron nitride sintered body obtained as described above was machined into a cutting tool having an ISO certified CNGA120408 insert shape through the steps of: cutting out such cubic boron nitride sintered body into a predetermined tool shape (see below) using an electric discharge machine; joining the resultant cubic boron nitride sintered body to a cemented carbide base metal via brazing; and performing honing on a pre-honing tool. It should be noted that, in the above machining, the cutting tool was obtained such that the cutting edge in its entirety consists of the cubic boron nitride sintered body.

After the cubic boron nitride sintered body was machined into the cutting tool, with regard to invention samples 1 to 16 and comparative samples 1 and 2, a picosecond laser process was performed on the cubic boron nitride sintered body under the conditions shown in Table 3. At this time, as to invention samples 10 to 16, after an adjustment to the irradiation area for a picosecond laser process and also after the performance of the picosecond laser process, a polishing process was performed on the cubic boron nitride sintered body. Thus, control was carried out over the area of the binder phase enriched layer in the surface of the cubic boron nitride sintered body. As to the cubic boron nitride sintered body of comparative sample 3, the surface thereof was processed, using a nanosecond laser, under conditions where the nanosecond laser has: an output of 30 W; a pulse width of 100 ns; a frequency of 18 kHz; and a travel speed of 2,000 mm/s. The nanosecond laser has more influence than a picosecond laser in the depth direction below the surface of the cubic boron nitride sintered body. Therefore, the nanosecond laser travel speed was set so as to be high. As to comparative samples 4 to 8, no picosecond laser process was performed. It should be noted that, as to comparative samples 4 and 5, a layer could be obtained in which the compositions differed from each other between the inner side of the cubic boron nitride sintered body and the surface side thereof.

TABLE 3

| Sample No. | Output (W) | Pulse width (ps) | Frequency (kHz) | Travel speed of picosecond laser (mm/s) |
|---|---|---|---|---|
| Invention sample 1 | 6.0 | 10 | 1,200 | 1,200 |
| Invention sample 2 | 6.0 | 10 | 1,200 | 1,200 |
| Invention sample 3 | 6.0 | 10 | 1,200 | 1,200 |
| Invention sample 4 | 6.0 | 10 | 1,200 | 1,200 |
| Invention sample 5 | 8.0 | 10 | 1,200 | 1,000 |
| Invention sample 6 | 10.0 | 15 | 1,000 | 1,200 |
| Invention sample 7 | 12.0 | 15 | 1,000 | 800 |
| Invention sample 8 | 11.0 | 15 | 1,200 | 800 |
| Invention sample 9 | 12.0 | 15 | 1,200 | 800 |
| Invention sample 10 | 6.0 | 15 | 1,200 | 1,200 |
| Invention sample 11 | 6.0 | 20 | 1,200 | 1,200 |
| Invention sample 12 | 4.0 | 20 | 1,000 | 1,000 |
| Invention sample 13 | 4.0 | 20 | 1,000 | 1,000 |
| Invention sample 14 | 6.0 | 20 | 1,000 | 1,500 |
| Invention sample 15 | 6.0 | 20 | 1,000 | 1,500 |
| Invention | 6.0 | 20 | 1,200 | 1,200 |

TABLE 3-continued

| Sample No. | Output (W) | Pulse width (ps) | Frequency (kHz) | Travel speed of picosecond laser (mm/s) |
|---|---|---|---|---|
| sample 16 | | | | |
| Comparative sample 1 | 6.0 | 10 | 1,200 | 1,200 |
| Comparative sample 2 | 8.0 | 10 | 1,200 | 1,000 |
| Comparative sample 3 | Nanosecond laser process in place of picosecond laser process | | | |
| Comparative sample 4 | No picosecond laser process | | | |
| Comparative sample 5 | No picosecond laser process | | | |
| Comparative sample 6 | No picosecond laser process | | | |
| Comparative sample 7 | No picosecond laser process | | | |
| Comparative sample 8 | No picosecond laser process | | | |

The area ratio of the binder phase enriched layer and the area ratio of the inner region based on the entire surface of the obtained cubic boron nitride sintered body tool were obtained by analyzing a structural photograph of the cubic boron nitride sintered body which had been taken by an SEM, using commercially available image analysis software. More specifically, a surface of the cubic boron nitride sintered body, which had been magnified 2,000 times using the SEM, was observed via a backscattered electron image. At this time, a structural photograph of the surface of the cubic boron nitride sintered body was taken using the SEM. With commercially available image analysis software, the area ratio of the binder phase enriched layer and the area ratio of the inner region were obtained from the taken structural photograph. At this time, the area ratio of the binder phase enriched layer and the area ratio of the inner region were obtained by filling the inner region with black in the structural photograph and then subjecting the resultant structural photograph to a binarization process by the image analysis software. The values are shown in Table 4. It should be noted that, as to the comparative samples, when the compositions differ between the surface side of the cubic boron nitride sintered body and the surface side thereof, the surface side region was defined as a binder phase enriched layer and the inner side region was defined as an inner region, for the purposes of description.

TABLE 4

| | Surface of cubic boron nitride sintered body | |
|---|---|---|
| Sample No. | Binder phase enriched layer (area %) | Inner region (area %) |
| Invention sample 1 | 100 | 0 |
| Invention sample 2 | 100 | 0 |
| Invention sample 3 | 100 | 0 |
| Invention sample 4 | 100 | 0 |
| Invention sample 5 | 50 | 50 |
| Invention sample 6 | 100 | 0 |
| Invention sample 7 | 100 | 0 |
| Invention sample 8 | 100 | 0 |
| Invention sample 9 | 100 | 0 |
| Invention sample 10 | 86 | 14 |
| Invention sample 11 | 72 | 28 |
| Invention sample 12 | 55 | 45 |
| Invention sample 13 | 38 | 62 |
| Invention sample 14 | 84 | 16 |
| Invention sample 15 | 62 | 38 |
| Invention sample 16 | 28 | 72 |
| Comparative sample 1 | 100 | 0 |
| Comparative sample 2 | 24 | 76 |
| Comparative sample 3 | 100 | 0 |
| Comparative sample 4 | 100 | 0 |
| Comparative sample 5 | 100 | 0 |
| Comparative sample 6 | 0 | 100 |
| Comparative sample 7 | 0 | 100 |
| Comparative sample 8 | 0 | 100 |

As to comparative sample 3 with the use of a nanosecond laser, a myriad of cracks were found in the surface of the cubic boron nitride sintered body. However, no cracks were observed with regard to the samples involving a picosecond laser process.

As to the tools obtained as described above, the composition of the cubit boron nitride sintered body was determined through x-ray diffraction measurement. Further, a photograph was taken of a cross-sectional structure of the cubic boron nitride sintered body, which had been magnified 5,000 times using an SEM. With regard to the photograph taken of the cross-sectional structure, the content (volume %) of cBN and the content of the binder phase (volume %) were measured, using commercially available image analysis software. At this time, a region which is located in the depth direction below the surface of the cubic boron nitride sintered body and in which a total content of the binder phase and the inevitable impurities is from 90 volume % or more to 100 volume % or less was defined as a binder phase enriched layer, and a region located more inward in terms of depth than the binder phase enriched layer was defined as an inner region. Further, the thickness of the binder phase enriched layer was measured from the photographs of cross-sectional structures at any three or more locations. The average value of the resulting thicknesses was defined as an average thickness of the binder phase enriched layer. The results are shown in Table 5.

TABLE 5

| | Cubic boron nitride sintered body | | | | | |
|---|---|---|---|---|---|---|
| | Inner region | | | Binder phase enriched layer | | |
| | cBN | Binder phase | | cBN | Binder phase | Average thickness |
| Sample No. | (volume %) | (volume %) | Composition | (volume %) | (volume %) | (μm) |
| Invention sample 1 | 19 | 81 | TiN, Ti(C, N), $Al_2O_3$ | 0 | 100 | 3.4 |
| Invention sample 2 | 43 | 57 | TiN, Ti(C, N), $TiB_2$, $Al_2O_3$, WC | 0 | 100 | 3.0 |
| Invention sample 3 | 58 | 42 | TiN, TiC, Ti(C, N), $TiB_2$, $Al_2O_3$, WC | 0 | 100 | 2.8 |
| Invention sample 4 | 72 | 28 | $ZrO_2$, ZrO, ZrN, $ZrB_2$, $Al_2O_3$ | 0 | 100 | 3.0 |
| Invention sample 5 | 82 | 18 | Co, Cr, Ni, $Al_2O_3$ | 9 | 91 | 0.2 |
| Invention sample 6 | 53 | 47 | TiN, Ti(C, N), $TiB_2$, WC, $Al_2O_3$ | 0 | 100 | 1.5 |
| Invention sample 7 | 58 | 42 | $Al_2O_3$, $Si_3N_4$ | 0 | 100 | 4.2 |
| Invention sample 8 | 53 | 47 | TiN, Ti(C, N), $TiB_2$, WC, $Al_2O_3$ | 0 | 100 | 5.8 |
| Invention sample 9 | 53 | 47 | TiN, Ti(C, N), $TiB_2$, WC, $Al_2O_3$ | 0 | 100 | 8.0 |
| Invention sample 10 | 58 | 42 | TiN, Ti(C, N), $TiB_2$, $Al_2O_3$, WC | 0 | 100 | 3.5 |
| Invention sample 11 | 58 | 42 | TiN, Ti(C, N), $TiB_2$, $Al_2O_3$, WC | 0 | 100 | 3.4 |
| Invention sample 12 | 38 | 62 | TiN, Ti(C, N), $TiB_2$, $Al_2O_3$, WC | 0 | 100 | 3.0 |
| Invention sample 13 | 38 | 62 | TiN, Ti(C, N), $TiB_2$, $Al_2O_3$, WC | 0 | 100 | 3.4 |
| Invention sample 14 | 72 | 28 | TiN, Ti(C, N), $TiB_2$, $Al_2O_3$, WC | 4 | 96 | 1.2 |
| Invention sample 15 | 72 | 28 | TiN, Ti(C, N), $TiB_2$, $Al_2O_3$, WC | 6 | 94 | 1.5 |
| Invention sample 16 | 58 | 42 | Ti(C, N), $TiB_2$, $Al_2O_3$, WC | 0 | 100 | 2.4 |
| Comparative sample 1 | 14 | 86 | Ti(C, N), $TiB_2$, $Al_2O_3$, WC | 0 | 100 | 4.2 |
| Comparative sample 2 | 87 | 13 | $Al_2O_3$, $Si_3N_4$ | 78 | 22 | 0.05 |
| Comparative sample 3 | 72 | 28 | TiN, Ti(C, N), $TiB_2$, $Al_2O_3$, WC | 20 | 80 | 1.4 |
| Comparative sample 4 | 58 | 42 | $Al_2O_3$, $Si_3N_4$ | 20 | 80 | 2.5 |
| Comparative sample 5 | 53 | 47 | TiN, Ti(C, N), $TiB_2$, WC, $Al_2O_3$ | 5 | 95 | 2.0 |
| Comparative sample 6 | 38 | 62 | TiN, Ti(C, N), $TiB_2$, $Al_2O_3$, WC | | None | |
| Comparative sample 7 | 58 | 42 | TiN, Ti(C, N), $TiB_2$, $Al_2O_3$, WC | | None | |
| Comparative sample 8 | 72 | 28 | TiN, Ti(C, N), $TiB_2$, $Al_2O_3$, WC | | None | |

The following cutting tests (wear resistance tests) were conducted using the obtained samples. The cutting test conditions were selected in accordance with the content of cBN contained in the cubic boron nitride sintered body. Cutting test 1 is a cutting test with the least rigid conditions, and the cutting conditions become more severe in the order of cutting test 1, cutting test 2 and cutting test 3. The results are shown in Tables 6, 7 and 8. However, as to comparative sample 5, cracks (cleavage) were found between the inner region and the binder phase enriched layer. Accordingly, it was determined that, as to comparative sample 5, no evaluations could be made in the cutting tests.

[Cutting Test 1]
Cutting method: Outer-periphery continuous cutting (turning)
Workpiece: Carburized and quenched SCM420
Workpiece shape: Cylinder of φ100 mm×250 mm
Cutting speed: 180 m/min
Depth of cut: 0.15 mm
Feed: 0.15 mm/rev
Coolant: Wet type
Evaluation samples: Invention samples 1, 12 and 13 and comparative samples 1 and 6
Evaluation items: A time when a sample was fractured or had a maximum flank wear width of 0.15 mm was defined as the end of the tool life, and the machining (cutting) time to reach the end of the tool life was measured.

[Cutting Test 2]
Cutting method: Outer-periphery continuous cutting (turning)
Workpiece: Carburized and quenched SCM420
Workpiece shape: Cylinder of φ100 mm×200 mm
Cutting speed: 150 m/min
Depth of cut: 0.25 mm
Feed: 0.15 mm/rev
Coolant: Wet type
Evaluation samples: Invention samples 2, 3, 6 to 11 and 16 and comparative samples 4 and 7
Evaluation items: A time when a sample was fractured (fracturing or minute chipping occurred) or had a maximum flank wear width of 0.15 mm was defined as the end of the tool life, and the machining (cutting) time to reach the end of the tool life was measured.

[Cutting Test 3]
Cutting method: Outer-periphery continuous cutting (turning)
Workpiece: Carburized and quenched SCM420
Workpiece shape: Cylinder of φ100 mm×200 mm
Cutting speed: 120 m/min
Depth of cut: 0.25 mm
Feed: 0.20 mm/rev
Coolant: Wet type
Evaluation samples: Invention samples 4, 5, 14 and 15 and comparative samples 2, 3 and 8
Evaluation items: A time when a sample was fractured or had a maximum flank wear width of 0.15 mm (normal wear) was defined as the end of the tool life, and the machining (cutting) time to reach the end of the tool life was measured.

TABLE 6

| | Cutting test 1 Wear resistance test | |
|---|---|---|
| Sample No. | Machining time (min) | Damage form |
| Invention sample 1 | 55 | Normal wear |
| Invention sample 12 | 62 | Normal wear |
| Invention | 58 | Normal wear |

TABLE 6-continued

Cutting test 1
Wear resistance test

| Sample No. | Machining time (min) | Damage form |
|---|---|---|
| sample 13 | | |
| Comparative sample 1 | 25 | Fracturing |
| Comparative sample 6 | 48 | Normal wear |

TABLE 7

Cutting test 2
Wear resistance test

| Sample No. | Machining time (min) | Damage form |
|---|---|---|
| Invention sample 2 | 60 | Normal wear |
| Invention sample 3 | 66 | Normal wear |
| Invention sample 6 | 62 | Normal wear |
| Invention sample 7 | 74 | Normal wear |
| Invention sample 8 | 80 | Normal wear |
| Invention sample 9 | 65 | Minute chipping |
| Invention sample 10 | 64 | Normal wear |
| Invention sample 11 | 61 | Normal wear |
| Invention sample 16 | 58 | Normal wear |
| Comparative sample 4 | 46 | Fracturing |
| Comparative sample 5 | | No evaluations were made because cracking occurred in the interface between the inner side and the surface side |
| Comparative sample 7 | 52 | Normal wear |

TABLE 8

Cutting test 3
Wear resistance test

| Sample No. | Machining time (min) | Damage form |
|---|---|---|
| Invention sample 4 | 70 | Normal wear |
| Invention sample 5 | 54 | Normal wear |
| Invention sample 14 | 68 | Normal wear |
| Invention sample 15 | 60 | Normal wear |
| Comparative sample 2 | 15 | Fracturing |
| Comparative sample 3 | 35 | Fracturing |
| Comparative sample 8 | 46 | Normal wear |

The machining time of the tool of each invention sample was longer than the machining time of the tool of each comparative sample. This indicates that, due to improved wear resistance, the life of the tool of each invention sample is longer than the life of the tool of each comparative sample.

Example 2

A coating layer was formed on the surface of each of invention samples 1 to 16 in Example 1, using a PVD apparatus. More specifically, invention samples 17 to 21 were respectively obtained from invention samples 1 to 5 by forming, as a coating layer, a TiN layer with an average thickness of 3 μm on the surface of the cubic boron nitride sintered body, and invention samples 22 to 27 were respectively obtained from invention samples 6 to 11 by forming, as a coating layer, a TiAlN layer with an average thickness of 3 μm on the surface of the cubic boron nitride sintered body. Further, invention samples 28 to 32 were respectively obtained from invention samples 12 to 16 by forming, as a coating layer, a laminate in which 50 TiAlN layers, each having an average thickness of 3 nm, and 50TiAlNbWN layers, each having an average thickness of 3 nm, were laminated in an alternating manner, on the surface of the cubic boron nitride sintered body. As to invention samples 17 to 32, cutting tests were conducted as shown in Example 1. The results are shown in Tables 9, 10 and 11.

TABLE 9

Cutting test 1
Wear resistance test

| Sample No. | Machining time (min) | Damage form |
|---|---|---|
| Invention sample 17 | 70 | Normal wear |
| Invention sample 28 | 79 | Normal wear |
| Invention sample 29 | 76 | Normal wear |

TABLE 10

Cutting test 2
Wear resistance test

| Sample No. | Machining time (min) | Damage form |
|---|---|---|
| Invention sample 18 | 78 | Normal wear |
| Invention sample 19 | 88 | Normal wear |
| Invention sample 22 | 81 | Normal wear |
| Invention sample 23 | 95 | Normal wear |
| Invention sample 24 | 101 | Normal wear |
| Invention sample 25 | 81 | Minute chipping |
| Invention sample 26 | 85 | Normal wear |
| Invention sample 27 | 78 | Normal wear |
| Invention sample 32 | 80 | Normal wear |

TABLE 11

| | Cutting test 3 Wear resistance test | |
|---|---|---|
| Sample No. | Machining time (min) | Damage form |
| Invention sample 20 | 90 | Normal wear |
| Invention sample 21 | 73 | Normal wear |
| Invention sample 30 | 93 | Normal wear |
| Invention sample 31 | 77 | Normal wear |

Invention samples 17 to 32 each involve a longer tool life than the tool life of each of the invention samples which do not involve the formation of a coating layer.

The present application is based on the Japanese patent application filed on Dec. 4, 2015 (JP Appl. 2015-237489), the content of which is incorporated herein by reference.

INDUSTRIAL APPLICABILITY

A tool and a coated tool according to the present invention are each excellent in terms of wear resistance and therefore have high industrial applicability.

REFERENCE SIGNS LIST

10: Sintered body, 12: Inner region, 14: Binder phase enriched layer, 20: Base metal, 100: Tool.

What is claimed is:

1. A tool in which at least part of a cutting edge thereof comprises a sintered body containing cubic boron nitride, wherein:
   the sintered body integrally and inseparably comprises an inner region and a binder phase enriched layer formed on at least part of a surface of the inner region;
   the inner region comprises: 15 volume % or more to 90 volume % or less of cubic boron nitride; and 10 volume % or more to 85 volume % or less of a mixture of a binder phase and impurities;
   the binder phase enriched layer comprises: 90 volume % or more to 100 volume % or less of the mixture of the binder phase and the impurities; and 0 volume % or more to 10 volume % or less of cubic boron nitride; and
   the binder phase contains at least one kind selected from the group consisting of: an element of at least one kind selected from the group consisting of Ti, Zr, Hf, V, Nb, Ta, Cr, Mo, W, Al, Co, Ni and Si; and a compound of the element and an element of at least one kind selected from the group consisting of C, N, O and B.

2. The tool according to claim 1, wherein, in a surface of the sintered body, the binder phase enriched layer constitutes from 30 area % or more to 100 area % or less of the surface of the sintered body in its entirety, and the inner region constitutes from 0 area % or more to 70 area % or less of the surface of the sintered body in its entirety.

3. The tool according to claim 1, wherein an average thickness of the binder phase enriched layer is from 0.1 μm or more to 8.0 μm or less.

4. The tool according to claim 1, wherein the binder phase comprises compositions of at least two kinds selected from the group consisting of Ti, Co, Cr, Ni, Al, AN, $Al_2O_3$, $AlB_2$, TiN, TiC, Ti(C,N), $TiB_2$, $Cr_2N$, WC, $ZrO_2$, ZrO, ZrN, $ZrB_2$ and $Si_3N_4$.

5. A coated tool comprising: the tool according to claim 1; and a coating layer formed on a surface of the tool.

6. The coated tool according to claim 5, wherein the coating layer contains a compound of: an element of at least one kind selected from the group consisting of Ti, Zr, Hf, V, Nb, Ta, Cr, Mo, W, Al and Si; and an element of at least one kind selected from the group consisting of C, N, O and B.

7. The coated tool according to claim 5, wherein the coating layer is comprised of a single layer or multiple layers of two or more layers.

8. The coated tool according to claim 5, wherein an average thickness of the coating layer in its entirety is from 0.5 μm or more to 20 μm or less.

9. The tool according to claim 2, wherein an average thickness of the binder phase enriched layer is from 0.1 μm or more to 8.0 μm or less.

10. The tool according to claim 2, wherein the binder phase comprises compositions of at least two kinds selected from the group consisting of Ti, Co, Cr, Ni, Al, AlN, $Al_2O_3$, $AlB_2$, TiN, TiC, Ti(C,N), $TiB_2$, $Cr_2N$, WC, $ZrO_2$, ZrO, ZrN, $ZrB_2$ and $Si_3N_4$.

11. The tool according to claim 9, wherein the binder phase comprises compositions of at least two kinds selected from the group consisting of Ti, Co, Cr, Ni, Al, AlN, $Al_2O_3$, $AlB_2$, TiN, TiC, Ti(C,N), $TiB_2$, $Cr_2N$, WC, $ZrO_2$, ZrO, ZrN, $ZrB_2$ and $Si_3N_4$.

12. The tool according to claim 3, wherein the binder phase comprises compositions of at least two kinds selected from the group consisting of Ti, Co, Cr, Ni, Al, AN, $Al_2O_3$, $AlB_2$, TiN, TiC, Ti(C,N), $TiB_2$, $Cr_2N$, WC, $ZrO_2$, ZrO, ZrN, $ZrB_2$ and $Si_3N_4$.

13. A coated tool comprising: the tool according to claim 2; and a coating layer formed on a surface of the tool.

14. The coated tool according to claim 13, wherein the coating layer contains a compound of: an element of at least one kind selected from the group consisting of Ti, Zr, Hf, V, Nb, Ta, Cr, Mo, W, Al and Si; and an element of at least one kind selected from the group consisting of C, N, O and B.

15. A coated tool comprising: the tool according to claim 3; and a coating layer formed on a surface of the tool.

16. A coated tool comprising: the tool according to claim 4; and a coating layer formed on a surface of the tool.

17. The coated tool according to claim 16, wherein the coating layer contains a compound of: an element of at least one kind selected from the group consisting of Ti, Zr, Hf, V, Nb, Ta, Cr, Mo, W, Al and Si; and an element of at least one kind selected from the group consisting of C, N, O and B.

18. The coated tool according to claim 6, wherein the coating layer is comprised of a single layer or multiple layers of two or more layers.

19. The coated tool according to claim 6, wherein an average thickness of the coating layer in its entirety is from 0.5 μm or more to 20 μm or less.

20. The coated tool according to claim 7, wherein an average thickness of the coating layer in its entirety is from 0.5 μm or more to 20 μm or less.

* * * * *